United States Patent
Miki et al.

(10) Patent No.: US 8,049,227 B2
(45) Date of Patent: Nov. 1, 2011

(54) GROUP III NITRIDE SEMICONDUCTOR LIGHT EMITTING DEVICE, METHOD FOR PRODUCING THE SAME, AND LAMP THEREOF

(75) Inventors: Hisayuki Miki, Chiba (JP); Hiromitsu Sakai, Chiba (JP)

(73) Assignee: Showa Denko K.K., Tokyo (JP)

( * ) Notice: Subject to any disclaimer, the term of this patent is extended or adjusted under 35 U.S.C. 154(b) by 275 days.

(21) Appl. No.: 12/293,918

(22) PCT Filed: Mar. 23, 2007

(86) PCT No.: PCT/JP2007/056044
§ 371 (c)(1),
(2), (4) Date: Dec. 11, 2008

(87) PCT Pub. No.: WO2007/111255
PCT Pub. Date: Oct. 4, 2007

(65) Prior Publication Data
US 2009/0206361 A1 Aug. 20, 2009

(30) Foreign Application Priority Data
Mar. 24, 2006 (JP) ................. P2006-082473

(51) Int. Cl.
*H01L 33/00* (2010.01)
(52) U.S. Cl. ............ 257/79; 257/98; 257/101; 257/103; 438/22; 438/29; 438/45
(58) Field of Classification Search ............ 257/79, 257/98, 101, 103, E51.021, E33.067; 438/22, 438/29, 45
See application file for complete search history.

(56) References Cited

U.S. PATENT DOCUMENTS

| | | | |
|---|---|---|---|
| 6,455,340 B1 * | 9/2002 | Chua et al. | 438/31 |
| 7,183,584 B2 | 2/2007 | Futagawa | |
| 2005/0179045 A1 | 8/2005 | Ryu et al. | |
| 2008/0230800 A1 * | 9/2008 | Bandoh et al. | 257/103 |

FOREIGN PATENT DOCUMENTS

| | | | |
|---|---|---|---|
| JP | 55-3834 B2 | | 1/1980 |
| JP | 2000-332364 A | | 11/2000 |
| JP | 2001-320085 A | | 11/2001 |
| JP | 2002-094112 A | | 3/2002 |
| JP | 2003-142730 | * | 5/2003 |
| JP | 2003-142730 A | | 5/2003 |
| JP | 2003-229645 A | | 8/2003 |
| JP | 2003-234542 A | | 8/2003 |
| JP | 2005-229085 A | | 8/2005 |
| WO | WO 2005/104251 | * | 11/2005 |

* cited by examiner

*Primary Examiner* — Benjamin Sandvik
*Assistant Examiner* — Farid Khan
(74) *Attorney, Agent, or Firm* — Sughrue Mion, PLLC (57) ABSTRACT

A group III nitride semiconductor light emitting device with a double sided electrode structure which has a low driving voltage as well as excellent light emission efficiency is provided, and the group III nitride semiconductor light emitting device includes at least an impurity layer 30 composed of a high concentration layer 3b made of a group III nitride semiconductor containing high concentration of impurity atoms, and a low concentration layer 3a made of a group III nitride semiconductor containing impurity atoms whose concentration is lower than that of the high concentration layer 3b; and a group III nitride semiconductor layer 2, and the lower concentration layer 3a and the high concentration layer 3b are continuously formed on the group III nitride semiconductor layer 2 in this order to form the group III nitride semiconductor light emitting device.

19 Claims, 3 Drawing Sheets

GROUP III NITRIDE SEMICONDUCTOR LIGHT EMITTING DEVICE, METHOD FOR PRODUCING THE SAME, AND LAMP THEREOF

TECHNICAL FIELD

The present invention relates to a group III nitride semiconductor light emitting device, a method for producing the same, and a lamp thereof. In particular, the present invention relates to a group III nitride semiconductor light emitting device that employs a semiconductor laminated structure having low resistance, excellent smoothness, a low driving voltage, and excellent device characteristics.

Priority is claimed on Japanese Patent Application No. 2006-082473, filed Mar. 24, 2006, the content of which is incorporated herein by reference.

BACKGROUND ART

A group III nitride semiconductor formed on a substrate has been used conventionally as a functional material for constituting a group III nitride semiconductor light emitting device having a pn junction structure such as a light emitting diode (LED) and a laser diode (LD) that irradiate short wavelength visible light (for example, refer to Patent Document 1). For example, in the LED emitting near ultraviolet light, blue light, or green light, n-type or p-type aluminum gallium nitride (compositional formula: $Al_XGa_YN$ where $0 \leq X, Y \leq 1$, and $X+Y=1$) is used to configure a cladding layer (for example, refer to Patent Document 2) and gallium indium nitride (compositional formula: $Ga_YIn_ZN$ where $0 \leq Y, Z \leq 1$, and $Y+Z=1$) is used to configure a light emitting layer (for example, refer to Patent Document 3).

In addition, a group III nitride semiconductor in which impurities such as silicon (Si) are doped is arranged in between the substrate and the light emitting layer and is used for controlling resistance.

Incidentally, since a sapphire substrate that is most widely used as a substrate constituting a group III nitride semiconductor light emitting device is an insulator and thus has a disadvantage of having low thermal conductivity, there is a demand for the development of substrates to serve as an alternative to the sapphire substrate. As an alternative substrate for the sapphire substrate, the use of a substrate that has high electrical and thermal conductivity and is composed of a group III nitride semiconductor crystal having the same crystal lattice constant as that of a group III nitride semiconductor has currently been proposed.

In addition, apart from the abovementioned substrate composed of the group III nitride semiconductor crystal, a substrate in which a group III nitride semiconductor layer is laminated on a base composed of a hetero substrate containing sapphire has been proposed as an alternative substrate for the sapphire substrate. In such a substrate, a laminated structure that serves as an LED is generally formed on the group III nitride semiconductor layer, which is laminated on the hetero substrate. Such a substrate is advantageous when different methods are used for growing crystals to produce the group III nitride semiconductor layer on the hetero substrate and for growing crystals to form the laminated structure that serves as an LED. In general, the hydride vapor phase epitaxy (HVPE) method, the molecular beam epitaxy (MBE) method, and the like are used as a method for forming the group III nitride semiconductor layer and the metalorganic chemical vapor deposition (MOCVD) method and the like are used for forming the laminated structure.

In addition, the substrate having the group III nitride semiconductor layer laminated therein will be electrically conductive when a hetero substrate composed of Si and ZnO is used as a base. For this reason, it is possible to configure a group III nitride semiconductor light emitting device having a double sided electrode structure, in which an electric current is conducted through the device in the vertical direction, by producing electrodes on both faces of the semiconductor light emitting device.

In addition, even when an insulating substrate such as a sapphire substrate is used as a base in the substrate having the group III nitride semiconductor layer laminated therein, it is possible to achieve a group III nitride semiconductor light emitting device having a double sided electrode structure by employing a technique to remove the sapphire substrate before forming the electrodes.

[Patent Document 1] Japanese Unexamined Patent Application, First Publication No. 2000-332364
[Patent Document 2] Japanese Unexamined Patent Application, First Publication No. 2003-229645
[Patent Document 3] Japanese Examined Patent Application, Second Publication No. Sho 55-3834

DISCLOSURE OF INVENTION

Problems to be Solved by the Invention

However, when producing a group III nitride semiconductor light emitting device having a double sided electrode structure by using a conventional substrate, in which a group III nitride semiconductor layer is laminated therein, it has been difficult to achieve a group III nitride semiconductor light emitting device that has a low driving voltage as well as excellent device characteristics as described below.

That is, when producing a group III nitride semiconductor light emitting device having a double sided electrode structure, resistance will be high if an insulating layer is formed inside the group III nitride semiconductor light emitting device which increases the driving voltage. Accordingly, no insulating layer can be formed inside the group III nitride semiconductor light emitting device.

However, when a doped group III nitride semiconductor layer is grown epitaxially in order to control resistance on the substrate, in which group III nitride semiconductor layers are laminated, pits and cracks are generated on the surface thereof causing reductions in the light emission efficiency, which is a problem. The cause of this problem is thought to be due to the aggregation of dopants, which are impurities, in an initial layer where the group III nitride semiconductor layer is grown.

In addition, when an undoped group III nitride semiconductor layer is grown epitaxially on the substrate, in which group III nitride semiconductor layers are laminated, few pits and cracks are generated on the surface thereof and satisfactory crystallinity is achieved. However, the resistance in the group III nitride semiconductor light emitting device will be high since the undoped group III nitride semiconductor layer is an insulating layer.

The present invention has been made in view of the above circumstances and its object is to provide a group III nitride semiconductor light emitting device having a double sided electrode structure which can solve the abovementioned problems and has a low driving voltage as well as excellent light emission efficiency.

In addition, another object of the present invention is to provide a lamp having excellent characteristics by using a group III nitride semiconductor light emitting device having a low driving voltage and excellent light emitting properties.

Means for Solving the Problems

That is, the present invention provides the following.

A first aspect of the present invention is a group III nitride semiconductor light emitting device including a semiconductor laminated structure, a light emitting layer composed of a group III nitride semiconductor, and electrodes each formed on the front surface and on the back surface of the semiconductor laminated structure characterized in that the semiconductor laminated structure includes at least an impurity layer composed of a high concentration layer made of a group III nitride semiconductor containing high concentration of impurity atoms, and a low concentration layer made of a group III nitride semiconductor containing impurity atoms whose concentration is lower than that of the high concentration layer; and a group III nitride semiconductor layer, and the lower concentration layer and the high concentration layer are continuously formed on the group III nitride semiconductor layer in this order.

A second aspect of the present invention is the group III nitride semiconductor light emitting device according to the above first aspect characterized in that a plurality of the impurity layers are provided, each arranged adjacent to one another.

A third aspect of the present invention is the group III nitride semiconductor light emitting device according to the above first aspect or second aspect characterized in that the thicknesses of the high concentration layer and the low concentration layer are both within the range of 0.5 to 500 nm.

A fourth aspect of the present invention is the group III nitride semiconductor light emitting device according to any one of the above first aspect to third aspect characterized in that a thickness of the low concentration layer is greater than or equal to a thickness of the high concentration layer.

A fifth aspect of the present invention is the group III nitride semiconductor light emitting device according to any one of the above first aspect to fourth aspect characterized in that 10 to 1000 layers of the impurity layer are laminated.

A sixth aspect of the present invention is the group III nitride semiconductor light emitting device according to any one of the above first aspect to fifth aspect characterized in that the thickness of the impurity layer as a whole is within the range of 0.1 to 10 μm.

A seventh aspect of the present invention is the group III nitride semiconductor light emitting device according to any one of the above first aspect to sixth aspect characterized in that a concentration of impurity atoms in the high concentration layer is within the range of $5 \times 10^{17}$ to $5 \times 10^{19}$ $cm^{-3}$.

An eighth aspect of the present invention is the group III nitride semiconductor light emitting device according to any one of the above first aspect to seventh aspect characterized in that a concentration of impurity atoms in the low concentration layer is less than or equal to $2 \times 10^{19}$ $cm^{-3}$.

A ninth aspect of the present invention is the group III nitride semiconductor light emitting device according to any one of the above first aspect to eighth aspect characterized in that the impurity atoms are those of one element selected from the group consisting of silicon (Si), germanium (Ge), sulfur (S), selenium (Se), tin (Sn), and tellurium (Te) or those in which two or more of these elements.

A tenth aspect of the present invention is the group III nitride semiconductor light emitting device according to any one of the above first aspect to ninth aspect characterized in that the group III nitride semiconductor layer is made of an electrically conductive gallium nitride based compound semiconductor.

An eleventh aspect of the present invention is the group III nitride semiconductor light emitting device according to any one of the above first aspect to tenth aspect characterized in that the group III nitride semiconductor layer is formed on an electrically conductive base.

A twelfth aspect of the present invention is the group III nitride semiconductor light emitting device according to the above eleventh aspect in which a conductivity type of the impurity layer is the same as that of the base.

In the present invention, when it is described that the conductivity type of the impurity layer is the same as that of the base, this refers to the state where the conductivity type of the impurity layer is n-type when the conductivity type of the base is also n-type, and the conductivity type of the impurity layer is p-type when the conductivity type of the base is also p-type.

A thirteenth aspect of the present invention is the group III nitride semiconductor light emitting device according to the above eleventh aspect or twelfth aspect characterized in that the base is made of silicon (Si) or zinc oxide (ZnO).

A fourteenth aspect of the present invention is a method for producing a group III nitride semiconductor light emitting device that includes a semiconductor laminated structure, a light emitting layer composed of a group III nitride semiconductor, and electrodes each formed on the front surface and on the back surface of the semiconductor laminated structure and in which the semiconductor laminated structure includes at least an impurity layer composed of a high concentration layer made of a group III nitride semiconductor containing high concentration of impurity atoms, and a low concentration layer made of a group III nitride semiconductor containing impurity atoms whose concentration is lower than that of the high concentration layer; and a group III nitride semiconductor layer, the method including a step for forming the lower concentration layer and the high concentration layer continuously on the group III nitride semiconductor layer in this order.

A fifteenth aspect of the present invention is the method for producing a group III nitride semiconductor light emitting device according to the above fourteenth aspect characterized in that the impurity layer is formed by doping the impurity atoms only in a step for forming the high concentration layer.

A sixteenth aspect of the present invention is the method for producing a group III nitride semiconductor light emitting device according to the above fourteenth aspect or fifteenth aspect characterized by further including a step for forming the group III nitride semiconductor layer on a base.

A seventeenth aspect of the present invention is the method for producing a group III nitride semiconductor light emitting device according to the above sixteenth aspect characterized in that the base is electrically conductive.

An eighteenth aspect of the present invention is the method for producing a group III nitride semiconductor light emitting device according to the above sixteenth aspect characterized in that the base is insulative and a step for removing the base after forming the group III nitride semiconductor layer on the base is further included.

A nineteenth aspect of the present invention is the method for producing a group III nitride semiconductor light emitting device according to any one of the above fourteenth aspect to eighteenth aspect characterized in that the group III nitride semiconductor layer is made of a gallium nitride based compound semiconductor.

A twentieth aspect of the present invention is a lamp characterized by using the group III nitride semiconductor light emitting device according to any one of the above first aspect to thirteenth aspect.

Effects of the Invention

The group III nitride semiconductor light emitting device of the present invention includes a semiconductor laminated structure, a light emitting layer, and electrodes each formed on the front surface and on the back surface of the semiconductor laminated structure, and in which the semiconductor laminated structure includes at least an impurity layer composed of a high concentration layer and a low concentration layer, and a group III nitride semiconductor layer, and the lower concentration layer and the high concentration layer are continuously formed on the group III nitride semiconductor layer in this order. Accordingly, it is possible to achieve a group III nitride semiconductor light emitting device having a double sided electrode structure and which has a low driving voltage as well as excellent device characteristics. More specifically, few pits and cracks are generated on the surface and satisfactory crystallinity is achieved when the low concentration layer is formed on the group III nitride semiconductor layer. In addition, the resistance of the impurity layer reduces resulting in the reduction of the resistance in the group III nitride semiconductor light emitting device when the high concentration layer is formed on the low concentration layer. Therefore, the semiconductor laminated structure having an impurity layer and in which a low concentration layer and a high concentration layer are continuously formed on a group III nitride semiconductor layer will have a low resistance as a whole and will also be excellent in terms of smoothness. Accordingly, the group III nitride semiconductor light emitting device of the present invention will have a low driving voltage as well as excellent light emission efficiency.

Moreover, in the group III nitride semiconductor light emitting device of the present invention, the low concentration layer is formed on the high concentration layer when a plurality of impurity layers are formed and each of which is arranged adjacent to one another. Accordingly, an advantageous effect is attained, that is, the pits and cracks formed in the high concentration layer will be filled by the low concentration layer. Therefore, the group III nitride semiconductor light emitting device will have an even more excellent semiconductor laminated structure in terms of smoothness.

In addition, according to the method for producing a group III nitride semiconductor light emitting device of the present invention, the low concentration layer and the high concentration layer are formed continuously on the group III nitride semiconductor layer in this order. Accordingly, due to the abovementioned effects of the low concentration layer to improve crystallinity and the high concentration layer to improve electrical conductivity, an impurity layer having a low resistance as a whole as well as excellent smoothness is formed, thereby achieving a group III nitride semiconductor light emitting device that has a low driving voltage as well as excellent light emission efficiency.

Moreover, since the lamp of the present invention is one that uses the group III nitride semiconductor light emitting device of the present invention, it will have a low driving voltage and excellent light emitting properties.

BEST MODE FOR CARRYING OUT THE INVENTION

An embodiment of the present invention will be described below by referring to the drawings. However, it should be noted that the present invention is not limited to each element of the following embodiment and, for example, constituting elements in this embodiment may be combined where appropriate.

Figure 1:
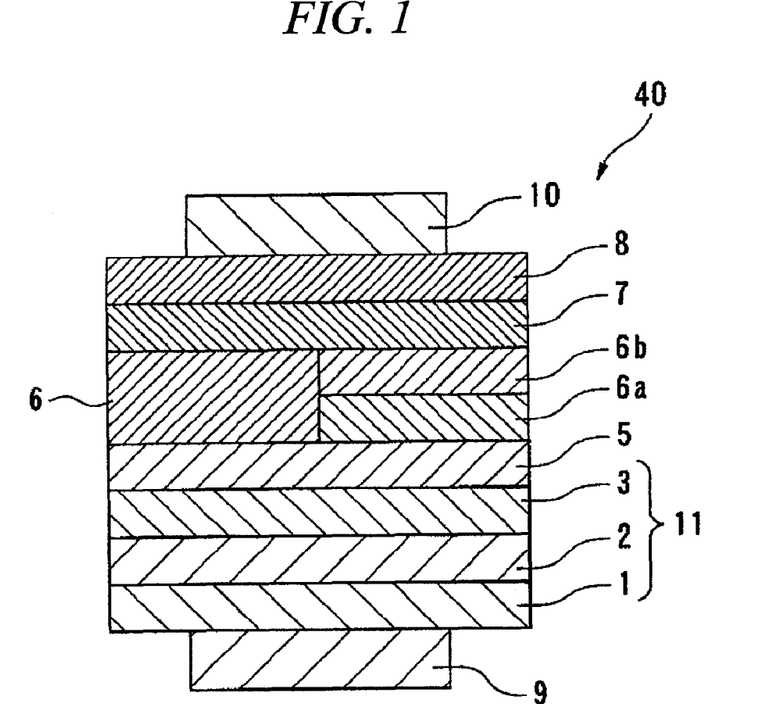
FIG. 1 is a cross sectional diagram schematically showing one example of the group III nitride semiconductor light emitting device of the present invention.
Figure 2:
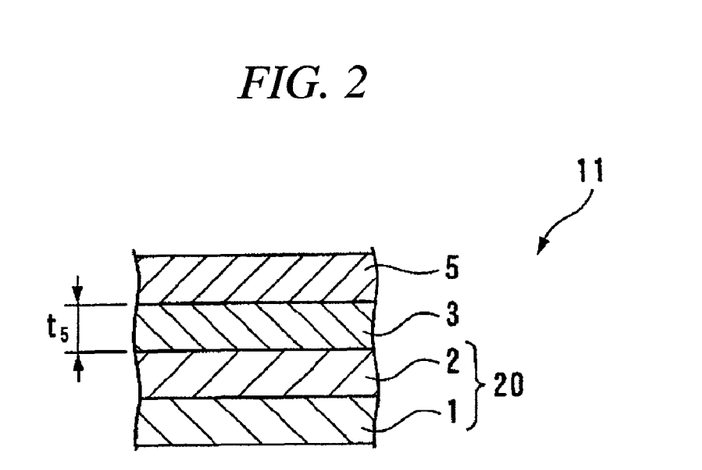
FIG. 2 is a cross sectional diagram schematically showing a semiconductor laminated structure provided in the group III nitride semiconductor light emitting device shown in FIG. 1.
Figure 3:
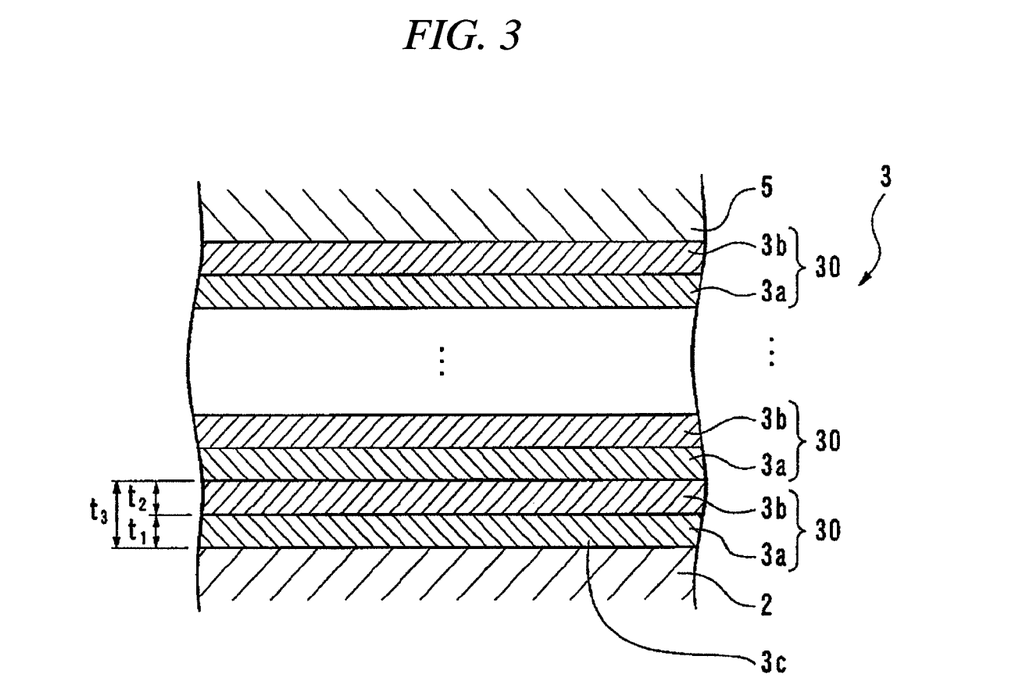
FIG. 3 is a cross sectional diagram schematically showing an impurity layer constituting the semiconductor laminated structure that is provided in the group III nitride semiconductor light emitting device shown in FIG. 1.

FIG. 1 is a cross sectional diagram schematically showing one example of the group III nitride semiconductor light emitting device of the present invention. In addition, FIG. 2 is a cross sectional diagram schematically showing the semiconductor laminated structure provided in the group III nitride semiconductor light emitting device shown in FIG. 1. In addition, FIG. 3 is a cross sectional diagram schematically showing the impurity layer constituting the semiconductor laminated structure that is provided in the group III nitride semiconductor light emitting device shown in FIG. 1.

In FIG. 1, the reference numerals 40 and 11 indicate a group III nitride semiconductor light emitting device serving as an LED chip and a semiconductor laminated structure, respectively. As shown in FIG. 2, the semiconductor laminated structure 11 is composed of a substrate 20 constituted from a base 1 and a group III nitride semiconductor layer 2, and a repetitive impurity layer 3 formed on the group III nitride semiconductor layer 2 of the substrate 20. In addition, as shown in FIG. 1, a cladding layer 5, a light emitting layer 6, a barrier layer 6a, a well layer 6b, a p-type cladding layer 7, and a p-type contact layer 8 are laminated on the semiconductor laminated structure 11. Moreover, a p-type ohmic electrode 10 is provided in the front surface side (the upper side in FIG. 1) of the semiconductor laminated structure 11 whereas an n-type ohmic electrode 9 is provided in the back surface side (the lower side in FIG. 1) of the semiconductor laminated structure 11, thereby configuring a group III nitride semiconductor light emitting device 40 having a double sided electrode structure.

As shown in FIG. 2, the substrate 20 is configured by providing the group III nitride semiconductor layer 2 on the base 1 when the base 1 is made of an electrically conductive material. However, when an insulating material is used as the base 1, after forming the group III nitride semiconductor layer 2 on the base 1, the base 1 is removed before forming the n-type ohmic electrode 9.

In the present invention, examples of the materials to be used as the base 1 where the group III nitride semiconductor layer 2 will be laminated include substrates made of oxide single crystal materials having relatively high melting points and which are heat resistant such as sapphire (α-Al$_2$O$_3$ single crystal), zinc oxide (ZnO), and gallium lithium oxide (compositional formula: LiGaO$_2$), and group IV semiconductor single crystals such as a silicon single crystal (silicon) and cubic or hexagonal silicon carbide (SiC). In addition, a group III-V compound semiconductor single crystal material such as gallium phosphide (GaP) can also be employed as a material for the base 1.

A sapphire substrate is preferable as the base 1 where the group III nitride semiconductor layer 2 will be laminated. However, since the sapphire substrate is insulative, it needs to be removed before the formation of the n-type ohmic electrode 9.

When the base 1 on which the group III nitride semiconductor layer 2 will be laminated is insulative, the removal of the base 1 is preferably carried out by a wet method in the case where a chemical solution that dissolves the base 1 is available since the method is most simple. However, there are cases where a chemical solution that dissolves the base 1 is unavailable or the chemical solution that dissolves the base 1 is difficult to handle. In such a case, it is necessary to peel off the base 1. For example, when peeling the sapphire substrate, a peeling method which thermally destructs the interface using an excimer laser or the like is most effective.

In addition, when preparing the base 1 with an electrically conductive material, substrates made of Si or ZnO are suitably used. When preparing the base 1 with an electrically conductive material, it is desirable to use an optically transparent single crystal material that can transmit light emitted from the light emitting layer 6.

In addition, the group III nitride semiconductor layer 2 is constituted from an n-type group III nitride semiconductor such as those represented by a general compositional formula $Al_X Ga_Y In_Z N_{1-a} M_a$ ($0 \leq X \leq 1$, $0 \leq Y \leq 1$, $0 \leq Z \leq 1$, as well as X+Y+Z=1, and the symbol M represents a group V element different from nitrogen (N) and $0 \leq a < 1$), desirably an n-type gallium nitride based compound semiconductor.

Examples of the method for growing the group III nitride semiconductor layer 2 on the base 1 include vapor phase growth methods such as the metalorganic chemical vapor deposition method (abbreviated as MOCVD, MOVPE, or OMVPE), the molecular beam epitaxy (MBE) method, the halogen vapor phase growth method, and the hydride vapor phase epitaxy (HVPE) method. Apart from the abovementioned vapor phase growth methods, the group III nitride semiconductor layer 2 can also be formed by, for example, a physical vapor phase deposition method such as a deposition method and a sputtering method or a method involving the coating of a solution followed by a heat treatment. Among the abovementioned methods for forming the group III nitride semiconductor layer 2, the MBE method and the HVPE method are preferable.

It should be noted that when there is a lattice mismatch between the base 1 and the group III nitride semiconductor layer 2 formed on the base 1, it is desirable to alleviate the lattice mismatch by laminating the base 1 and the group III nitride semiconductor layer 2 with a buffer layer, on which the group III nitride semiconductor layer 2 having excellent crystallinity is formed, interposed therebetween. The buffer layer can be constituted from, for example, aluminum gallium nitride (compositional formula: $Al_X Ga_Y N$ where $0 \leq X, Y \leq 1$, and X+Y=1) and the like.

In addition, as shown in FIG. 3, the repetitive impurity layer 3 formed on the group III nitride semiconductor layer 2 constituting the substrate 20 is configured from a plurality of impurity layers 30 composed of high concentration layers 3b and low concentration layers 3a arranged adjacent to each other. As shown in FIG. 3, since a plurality of impurity layers 30 are arranged adjacent to each other, the repetitive impurity layer 3 is configured so that high concentration layers 3b and low concentration layers 3a are laminated alternately. In addition, as shown in FIG. 3, a layer 3c in the impurity layer 30 formed directly on the group III nitride semiconductor layer 2 is a low concentration layer 3a so that the low concentration layer 3a and the high concentration layer 3b are continuously formed on the group III nitride semiconductor layer 2 in this order.

The high concentration layer 3b is made of a group III nitride semiconductor containing a high concentration of impurity atoms. In addition, the low concentration layer 3a is made of a group III nitride semiconductor containing impurity atoms at a lower concentration than that in the high concentration layer 3b.

As the group III nitride semiconductor constituting the high concentration layer 3b and the low concentration layer 3a, those materials having a compositional formula of $Al_X B_Y In_Z Ga_{1-X-Y-Z} N_{1-i-j} P_i As_j$ ($0 \leq X \leq 1$, $0 \leq Y \leq 1$, $0 \leq Z \leq 1$, $0 \leq j < 1$, and $0 \leq i \leq 1$) and the like can be used.

The repetitive impurity layer 3 shown in FIG. 3 can be formed by vapor phase growth methods such as the metalorganic chemical vapor deposition method (abbreviated as MOCVD, MOVPE, or OMVPE), the molecular beam epitaxy (MBE) method, the halogen vapor phase growth method, and the hydride vapor phase epitaxy method. Among these, the MOCVD method is preferable.

In the MOCVD method, hydrogen ($H_2$) or nitrogen ($N_2$), trimethylgallium (TMG) or triethylgallium (TEG), trimethylaluminum (TMA) or triethylaluminum (TEA), timethylindium (TMI) or triethylindium (TEI), ammonia ($NH_3$), hydrazine ($N_2H_4$), or the like are used as a carrier gas; a Ga source, an Al source, and an In source which are group III materials; and an N source, respectively.

In addition, in the MOCVD method, a group III nitride semiconductor layer is preferably grown depending on purpose on the group III nitride semiconductor layer 2 within a temperature range of 900° C. to 1,250° C.

Moreover, when the repetitive impurity layer 3 is formed on the group III nitride semiconductor layer 2, a low concentration layer 3a is first formed directly on the group III nitride semiconductor layer 2 followed by the formation of a high concentration layer 3b on the low concentration layer 3a. The high concentration layer 3b and the low concentration layer 3a are formed by changing the amount of a doping source, which is an impurity, supplied to a vapor phase growth reaction system at the time of vapor phase growth of a group III nitride semiconductor layer, which is to become the high concentration layer 3b and the low concentration layer 3a.

For example, an undoped layer, that is, a low concentration layer 3a having zero concentration of impurity atoms is first formed without supplying an impurity doping source to the vapor phase growth reaction system, and then a high concentration layer 3b containing a high concentration of impurity atoms is formed by supplying a large amount of an impurity doping source instantaneously to the vapor phase growth reaction system. In such a case, the impurity layer 30 is formed by doping impurity atoms only in the step for forming the high concentration layer 3b.

In addition, it is also possible to first grow a low concentration layer 3a containing a low concentration of impurity atoms by adjusting growth conditions, such as the ratio between a group III source material and a group V source material, to those suited for growing the low concentration layer 3a, and thereafter, stops the growth temporarily, and then grow a high concentration layer 3b containing a high concentration of impurity atoms by adjusting growth conditions, such as the ratio between a group III source material and a group V source material, to those suited for growing the high concentration layer 3b.

By increasing and decreasing the amount of impurity doping source supplied to the vapor phase growth reaction system with time during the vapor phase growth of a group III nitride semiconductor layer, which is to become the high concentration layer 3b and the low concentration layer 3a as described so far, the high concentration layer 3b and the low concentration layer 3a are continuously formed as shown in FIG. 3, thereby forming the high concentration layer 3b and the low concentration layer 3a having different concentrations of impurity atoms alternately and periodically.

Note that the layer 3c in the impurity layer 30 formed directly on the group III nitride semiconductor layer 2 is a low concentration layer 3a as shown in FIG. 3. Generation of cracks and pits on the surface due to the formation of the impurity layer 30 is prevented by forming a low concentration layer 3a directly on the group III nitride semiconductor layer 2.

Dopants which are the impurity atoms contained in the high concentration layer 3b and the low concentration layer 3a may be p-type or n-type. However, since many group III nitride semiconductor light emitting devices adopt a structure where a p-type layer is formed on the outermost surface, an n-type impurity layer is formed closed to the substrate in many cases. Accordingly, an n-type impurity layer is desirable as the repetitive impurity layer formed on the group III nitride semiconductor layer 2 of the substrate 20.

Silicon (Si), germanium (Ge), tin (Sn), sulfur (S), selenium (Se), tellurium (Te), and the like can be used as n-type impurities. Examples of the usable source material for an n-type impurity to be doped include hydrides of the respective elements such as monosilane ($SiH_4$), disilane ($Si_2H_6$), germane ($GeH_4$), hydrogen sulfide ($H_2S$), hydrogen selenide ($H_2Se$), hydrogen telluride ($H_2Te$); and organic compounds of the respective elements such as tetramethylsilicon (($CH_3)_4Si$), tetraethylsilicon (($C_2H_5)_4Si$), tetramethylgermanium (($CH_3)_4Ge$), tetraethylgermanium (($C_2H_5)_4Ge$), diethylselenium (($C_2H_5)_2Se$), diisopropylselenium (($C_3H_7)_2Se$), diethyl sulfide (($C_2H_5)_2S$), diisopropyl sulfide (($C_3H_7)_2S$), tetramethyltin (($CH_3)_4Sn$), tetraethyltin (($C_2H_5)_4Sn$), dimethyltellurium (($CH_3)_2Te$), and diethyltellurium (($C_2H_5)_2Te$). In addition, in the MBE method, an elemental form (a metal) can also be used as a doping source.

In addition, magnesium (Mg), calcium (Ca), zinc (Zn), and the like can be used as p-type impurities. Examples of the usable source material for a p-type impurity to be doped include organic compounds of the respective elements such as biscyclopentadienyl magnesium (($C_5H_{10})_2Mg$), bismethylcyclopentadienyl magnesium (($CH_3$—$C_5H_9)_2Mg$), and dimethylzinc (($CH_3)_2Zn$). In addition, in the MBE method, an elemental form (a metal) can also be used as a doping source.

Moreover, the concentration of impurity atoms in the high concentration layer 3b is preferably $5\times10^{17}$ $cm^{-3}$ to $5\times10^{19}$ $cm^{-3}$, more preferably $1\times10^{18}$ $cm^{-3}$ to $3\times10^{19}$ $cm^{-3}$, and particularly preferably $3\times10^{18}$ $cm^{-3}$ to $2\times10^{19}$ $cm^{-3}$.

When the concentration of impurity atoms in the high concentration layer 3b is less than $5\times10^{17}$ $cm^{-3}$, the resistance of the repetitive impurity layer 3 as a whole will be high and it will be difficult to achieve the group III nitride semiconductor light emitting device 40 with a low forward voltage. On the other hand, when the concentration of impurity atoms in the high concentration layer 3b exceeds $5\times10^{19}$ $cm^{-3}$, the carrier concentration in the high concentration layer 3b will be, on average, higher than 3 to $4\times10^{19}$ $cm^{-3}$. It is not preferable to dope impurity atoms at a concentration higher than this carrier concentration since the densities of cracks and pits generated in the surface of the high concentration layer 3b rapidly increase.

Note that the concentration of impurity atoms in the high concentration layer 3b do not have to necessarily be constant throughout the repetitive impurity layer 3 and it may continuously or discontinuously change in the respective impurity layers 30. In addition, the concentration of impurity atoms may change inside each of the low concentration layers 3b. Moreover, impurity atoms do not have to be composed of one element and two or more different elements may be combined.

In addition, the concentration of impurity atoms in the low concentration layer 3a is preferably lower than that in the high concentration layer 3b and also less than or equal to $2\times10^{19}$ $cm^{-3}$. When the concentration of impurity atoms in the low concentration layer 3a is greater than $2\times10^{19}$ $cm^{-3}$, it is not preferable since the densities of cracks and pits generated in the surface of the low concentration layer 3a rapidly increase. The concentration of impurity atoms in the low concentration layer 3a is preferably less than or equal to $1\times10^{19}$ $cm^{-3}$, and particularly preferably less than or equal to $5\times10^{18}$ $cm^{-3}$.

In addition, the lower the concentration of impurity atoms in the low concentration layer 3a is, the better, and it is preferable not to dope impurity atoms deliberately when growing the low concentration layer 3a. In order to make the concentration of impurity atoms low in the low concentration layer 3a, it is preferable to configure the low concentration layer 3a with an undoped group III nitride semiconductor since the effects to fill in the cracks and pits generated on the surface of the high concentration layer 3b will be further enhanced, and thus the impurity layer 30 having an even smoother surface can be obtained. It should be noted that since the resistance will increase as the concentration of impurity atoms in the low concentration layer 3a and the carrier concentration reduce, it is desirable to make the thickness of the low concentration layer 3a thin.

In addition, similar to the case in the high concentration layer 3b, the concentration of impurity atoms in the low concentration layer 3a do not have to necessarily be constant throughout the semiconductor layer and it may continuously or discontinuously change in the respective impurity layers 30. In addition, the concentration of impurity atoms may change inside each of the high concentration layers 3a. Moreover, impurity atoms do not have to be composed of one element and two or more different elements may be combined.

The concentration of impurity atoms and the element type can be verified by, for example, a measurement using the secondary ion mass spectrometry (SIMS) method. The secondary ion mass spectrometry is a technique of irradiating a primary ion on the sample surface and mass-analyzing the ionized element emitted from the surface, and the concentration distribution of a specific element in the depth direction can be observed and quantitatively determined. It is also effective to verify the presence of impurity elements in the group III nitride semiconductor layer by the secondary ion mass spectrometry method. Moreover, the thickness of each layer can also be calculated when verifying the concentration of impurity atoms and the element type by the secondary ion mass spectrometry method.

In addition, a film thickness $t_2$ of the high concentration layer 3b is suitably greater than or equal to 0.5 m and less than or equal to 500 nm, preferably, greater than or equal to 2 nm and less than or equal to 200 nm, and more preferably, greater than or equal to 3 nm and less than or equal to 50 nm. When the film thickness $t_2$ of the high concentration layer 3b is less than 0.5 nm, the doping amount of impurities into the repetitive impurity layer 3 as a whole will be insufficient leading to a high resistance therein. On the other hand, when the film thickness $t_2$ of the high concentration layer 3b is greater than 500 nm, the cracks and pits generated in the surface of the high concentration layer 3b cannot be filled sufficiently by the low concentration layer 3a, resulting in the impairment of the smoothness of the impurity layer 30. In addition, if a film thickness $t_1$ of the low concentration layer 3a is made sufficiently large in order to fill in the cracks and pits generated in the surface of the high concentration layer 3b, the resistance in the repetitive impurity layer 3 as a whole will become high.

Moreover, similar to the high concentration layer 3b, the film thickness $t_1$ of the low concentration layer 3a is preferably greater than or equal to 0.5 nm and less than or equal to 500 nm, more preferably, greater than or equal to 2 nm and less than or equal to 200 nm, and particularly preferably, greater than or equal to 3 nm and less than or equal to 50 nm. When the film thickness $t_1$ of the low concentration layer 3a is less than 0.5 nm, the cracks and pits generated in the surface of the high concentration layer 3b cannot be filled sufficiently, resulting in the impairment of the smoothness of the impurity layer 30. In addition, when the film thickness $t_1$ of the low concentration layer 3a is greater than 500 nm, the resistance in the repetitive impurity layer 3 as a whole will become high, which will be disadvantageous in achieving the group III nitride semiconductor light emitting device 40 having a low forward voltage (Vf) or a low threshold voltage (Vth).

In addition, a film thickness $t_3$ of the impurity layer 30 composed of the high concentration layer 3b and the low concentration layer 3a that are provided adjacent to each other is suitably greater than or equal to 1 nm and less than or equal to 1,000 nm, preferably, greater than or equal to 4 nm and less than or equal to 400 nm, and more preferably, greater than or equal to 6 nm and less than or equal to 100 nm. When the film thickness $t_3$ of the impurity layer 30 is greater than 1,000 nm, the formation of cracks and pits cannot be suppressed or the resistance in the repetitive impurity layer 3 as a whole will become high. In addition, when the film thickness $t_3$ of the impurity layer 30 is less than 1 nm, the supply amount of impurity atoms must be changed frequently, and thus working efficiency reduces.

Moreover, when the film thickness $t_2$ of the high concentration layer 3b is thicker than the film thickness $t_1$ of the low concentration layer 3a in each of the impurity layer 30, the formation of cracks and pits will not be suppressed sufficiently and satisfactory smoothness is not achieved. On the other hand, satisfactory smoothness is achieved when the film thickness $t_1$ of the low concentration layer 3a is equal to or thicker than the film thickness $t_2$ of the high concentration layer 3b in each of the impurity layer 30. Therefore, it is preferable to make the film thickness $t_1$ of the low concentration layer 3a greater than or equal to the film thickness $t_2$ of the high concentration layer 3b.

In addition, the layer thickness $t_5$ of the repetitive impurity layer 3 as a whole is preferably greater than or equal to 0.1 μm and less than or equal to 10 μm, more preferably, greater than or equal to 0.3 μm and less than or equal to 5 μm, and particularly preferably, greater than or equal to 0.5 μm and less than or equal to 3 μm. When the total layer thickness $t_5$ of the repetitive impurity layer 3 is less than 0.1 μm, the forward voltage of the group III nitride semiconductor light emitting device 40 will be high. In addition, even if the thickness $t_5$ of the repetitive impurity layer 3 is made to exceed 10 μm, the effects achieved therefrom are negligible and merely result in an increase in cost.

In view of the abovementioned thicknesses $t_3$ and $t_5$ of each of the impurity layers 30 and the entire repetitive impurity layer 3, respectively, the number of the laminated impurity layers 30 is preferably greater than or equal to 1 and less than or equal to 10,000, more preferably greater than or equal to 10 and less than or equal to 1,000, and particularly preferably greater than or equal to 20 and less than or equal to 200. For example, when an impurity layer 30 composed of a high concentration layer 3b having a thickness of 10 nm and a low concentration layer 3a having a thickness of 10 nm is formed, a semiconductor laminated structure 11 having a total thickness of 2 μm is formed by laminating 100 layers of the impurity layer 30.

In addition, as shown in FIG. 1, the cladding layer 5 is formed on the repetitive impurity layer 3 in the semiconductor laminated structure 11. The light emitting layer 6 having a multiple quantum well structure including the barrier layer 6a and the well layer 6b, the p-type cladding layer 7, and the contact layer 8 are laminated on the cladding layer 5 in this order.

The light emitting layers of single quantum well structures and multiple quantum well structures having various compositions represented by the general compositional formula $Al_XGa_YIn_ZN_{1-a}M_a$ ($0 \leq X \leq 1, 0 \leq Y \leq 1, 0 \leq Z \leq 1$, as well as $X+Y+Z=1$, and the symbol M represents a group V element different from nitrogen and $0 \leq a < 1$) are known apart from the layer configuration shown in FIG. 1, and these light emitting layers can be used without any limitations. In addition, p-type group III nitride semiconductors for constituting the light emitting section of a double heterostructure in which a p-type dopant such as Mg and Zn is doped and which have various compositions represented by the abovementioned compositional formula are also known, and these semiconductors can be used without any limitations.

Moreover, as shown in FIG. 1, the p-type ohmic electrode 10 is provided in the upper surface side of the contact layer 8 whereas the n-type ohmic electrode 9 is provided on the surface (lower surface) of the base 1 in the side opposite to that of the group III nitride semiconductor layer 2, thereby configuring a group III nitride semiconductor light emitting device 40 having a double sided electrode structure. In the present invention, various configurations and structures known as positive electrodes and negative electrodes for the compound semiconductor light emitting devices can be used without any limitations. In addition, also regarding the method for producing them, known methods such as a vacuum deposition method, a sputtering method, and a photolithography technique can be used without any limitations.

Figure 4:
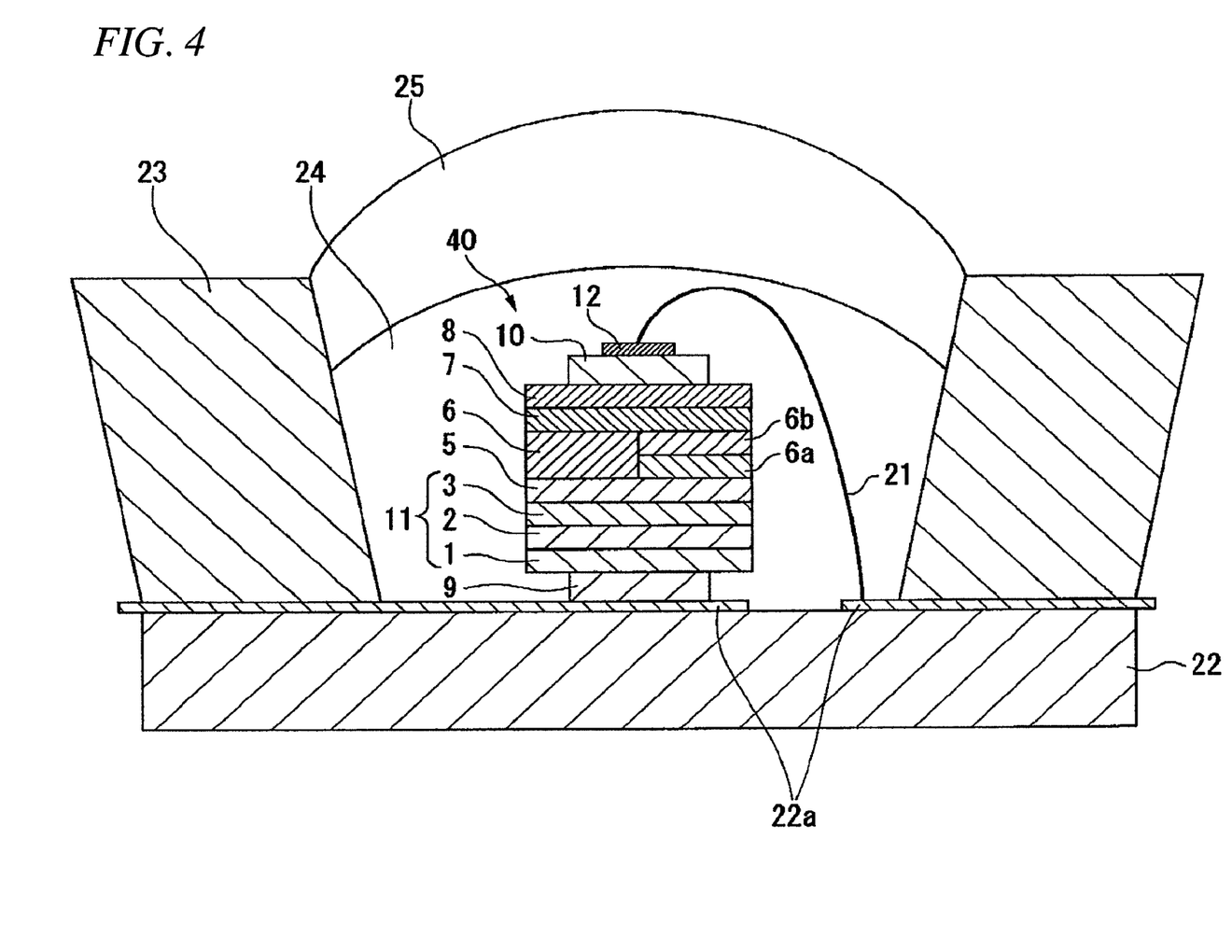
FIG. 4 is a cross sectional diagram schematically showing one example of a lamp of the present invention.

FIG. 4 is a cross sectional diagram schematically showing one example of a lamp of the present invention. The lamp shown in FIG. 4 is a top package type having the group III nitride semiconductor light emitting device 40 shown in FIG. 4 and which has the light emitting surface in the side where the p-type ohmic electrode 10 is present.

In FIG. 4, the reference numerals 22, 23, 24, and 25 indicate a lead frame, a reflector, fluorescent resin made of glass epoxy resin containing a silicate phosphor, and sealing resin made of glass epoxy resin, respectively.

As shown in FIG. 4, the n-type ohmic electrode 9 of the group III nitride semiconductor light emitting device 40 is fixed on and electrically conducted to one of the wiring boards 22a of the lead frame 22. In addition, a bonding pad 12 is formed on the upper surface of the p-type ohmic electrode 10 of the group III nitride semiconductor light emitting device 40. The bonding pad 12 is composed of a laminated structure of 5 layers, that is, Au/Ti/Al/Ti/Au (the thicknesses thereof are 50 nm, 20 nm, 10 nm, 100 nm, and 200 μm, respectively) and is wire-bonded to the other wiring board 22a through a gold wire 21.

The lamp shown in FIG. 4 can be produced by a conventionally known method using the group III nitride semiconductor light emitting device 40 of the present invention having a double sided electrode structure shown in FIG. 1. More specifically, for example, the lamp shown in FIG. 4 can be produced as follows; the group III nitride semiconductor light emitting device 40 is mounted on the lead frame 22. The n-type ohmic electrode 9 of the group III nitride semiconductor light emitting device 40 is fixed on one of the two wiring boards 22a using eutectic solder paste made of Au/Sn or the like while the p-type ohmic electrode 10 of the group III nitride semiconductor light emitting device 40 is connected to the other wiring board 22a via the bonding pad 12 and the gold wire 21. Thereafter, the fluorescent resin 24 is injected and then solidified by carrying out a heat treatment. Moreover, the entire reflector 23 is sealed by the sealing resin 25.

The present invention will be described below in more detail with reference to Examples. However, the present invention is not limited to these Examples.

EXAMPLE 1

A base 1 which was a Si (111) substrate was prepared. An n-type group III nitride semiconductor layer 2 made of Si-doped GaN was formed on the base 1 by a vacuum MBE method via a buffer layer made of AlN to obtain a substrate 20.

Subsequently, the repetitive impurity layer shown in FIG. 3 was formed on the group III nitride semiconductor layer 2 of the substrate 20, as described below, to obtain a semiconductor laminated structure 11 shown in FIG. 2.

To form the repetitive impurity layer 3, the substrate 20 was first introduced in an MOCVD apparatus and was mounted on a susceptor made of highly pure graphite for semiconductors which was heated to a film forming temperature by a radiofrequency (RF) induction heater. Thereafter, nitrogen gas was circulated in a vapor phase growth reaction furnace made of stainless steel for purging inside the furnace.

After circulating the nitrogen gas in the vapor phase growth reaction furnace for 8 minutes, the induction heater was activated to increase the temperature of the substrate 20 from room temperature to 600° C. over a period of 10 minutes. Hydrogen gas and nitrogen gas were then circulated while keeping the temperature of the substrate 20 at 600° C. so that the pressure in the vapor phase growth reaction furnace was $1.5 \times 10^4$ Pascal (Pa). It was then allowed to stand at this temperature and pressure for 2 minutes for thermal cleaning of the surface of the substrate 20. After completion of the thermal cleaning, supply of the nitrogen gas to the inside of the vapor phase growth reaction furnace was stopped. Supply of the hydrogen gas continued.

Ammonia ($NH_3$) gas was then supplied to the inside of the vapor phase growth reaction furnace and after 4 minutes of the gas supply, the temperature of the susceptor was increased to 1,120° C. while continuing circulation of the ammonia gas. Next, a low concentration layer 3a made of undoped GaN was grown by circulating trimethylgallium (TMG) for 18 seconds in the vapor phase growth reaction system without supplying any impurity doping source thereto. Thereafter, tetramethylgermanium (($CH_3$)$_4$Ge) was circulated for 18 seconds while continuing the circulation of TMG and ammonia gases to grow a high concentration layer 3b made of GaN containing germanium (Ge) as impurity atoms.

The step for growing the low concentration layer 3a and the step for growing the high concentration layer 3b were carried out continuously and alternately and this cycle was repeated 100 times to form a repetitive impurity layer 3 shown in FIG. 3 including an impurity layer 30, which was composed of a plurality of the high concentration layers 3b and the low concentration layers 3a arranged adjacent to each other.

When the semiconductor laminated structure 11 obtained as described above was analyzed by a secondary ion mass spectrometry (SIMS), the thickness of the high concentration layer 3b was 10 nm and the thickness of the low concentration layer 3a was 10 nm. In addition, as a result of the SIMS analysis, the concentration of impurity atoms in the high concentration layer 3b was found to be $1.2 \times 10^{19}$ cm$^{-3}$ and the concentration of impurity atoms in the low concentration layer 3a was found to be $1 \times 10^{18}$ cm$^{-3}$.

It should be noted that the SIMS analysis was conducted using Cs$^+$ as a primary ion species and an acceleration voltage of 14.5 keV and an ion current of 40 nA were adopted as the measurement conditions. In addition, the raster region was set to 100 μm$^2$ and the analysis region was set to 30 μm$^2$.

Moreover, the carrier concentration of the repetitive impurity layer 3 in the obtained semiconductor laminated structure 11 according to Hall measurement was $7 \times 10^{18}$ cm$^{-3}$. Furthermore, as a result of observing the surface of the repetitive impurity layer 3 using an optical microscope, the pit density was found to be less than or equal to 200 pits/cm$^2$ which verified that the surface was highly smooth.

Additionally, the thickness of the substrate 20 was 80 μm and the thickness of the semiconductor laminated structure 11 as a whole was 82 μm.

Next, a cladding layer 5 was formed on the repetitive impurity layer 3 of the semiconductor laminated structure 11 obtained as described above by depositing undoped n-type $In_{0.03}Ga_{0.97}N$ at 1,060° C. This cladding layer 5 was grown using triethylgallium (TEG) as a gallium source and trimethylindium (TMI) as an indium source, and its layer thickness was 12.5 nm.

Next, a light emitting layer 6 configured from a multiple quantum well structure having a 5-period structure including a barrier layer 6a composed of GaN and a well layer 6b composed of $In_{0.25}Ga_{0.75}N$ was provided on the cladding layer 5, with the temperature of the semiconductor laminated structure 11 at 730° C. The light emitting layer 6 having a multiple quantum well structure was provided by first joining the barrier layer 6a with the cladding layer 5.

Note that the barrier layer 6a was formed by growing undoped while using triethylgallium (TEG) as a gallium source. The thickness of the barrier layer 6a was 8 nm. In addition, the well layer 6 was formed by growing undoped while using triethylgallium (TEG) as a gallium source and trimethylindium (TMI) as an indium source. The thickness of the well layer 6b was 2.5 nm.

Subsequently, a p-type cladding layer 7 composed of magnesium (Mg)-doped p-type $Al_{0.07}Ga_{0.93}N$ was formed on the light emitting layer 6. The thickness of the obtained p-type cladding layer 7 was 10 nm. Moreover, a contact layer 8 composed of Mg-doped p-type GaN was further formed on the p-type cladding layer 7. As the Mg doping source, biscyclopentadienyl Mg was used. Note that Mg was added so that the hole concentration of contact layer 8 would be $8 \times 10^{17}$ cm$^{-3}$. The layer thickness of the p-type GaN contact layer 8 was 100 nm.

After the growth of the contact layer 8 was completed, the supply of electric current to the induction heater was stopped and the temperature of the semiconductor laminated structure 11 where the respective layers up to the contact layer 8 was laminated was lowered to room temperature over a period of about 20 minutes. During the temperature drop, the atmosphere inside the vapor phase growth reaction furnace was constituted only of nitrogen. After confirming that the temperature of the semiconductor laminated structure 11 where the respective layers up to the contact layer 8 was laminated was lowered down to room temperature, the laminated structure was taken outside from the vapor phase growth reaction furnace. At this point in time, the contact layer 8 already exhibited p-type conductivity even without performing an annealing treatment for electrically activating the p-type carrier (Mg).

Next, an n-type ohmic electrode 9 composed of ITO was formed on the surface (lower surface) of the base 1 opposite to the surface where the group III nitride semiconductor layer 2 was present using a photolithography technique. In addition, a p-type ohmic electrode 10 composed of ITO was formed on the surface of the contact layer 8 by using vacuum deposition means, photolithography means, or the like.

Then the bonding pad 12 composed of a laminated structure of 5 layers, that is, Au/Ti/Al/Ti/Au (the thicknesses thereof were 50 nm, 20 nm, 10 nm, 100 nm, and 200 nm, respectively) was formed on the upper surface of the p-type ohmic electrode 10.

Thereafter, the semiconductor laminated structure was cut into 200 μm square pieces using a dicer to obtain LED chips where the bonding pad 12 was formed on the group III nitride semiconductor light emitting device 40 shown in FIG. 1.

Then, as shown in FIG. 4, the group III nitride semiconductor light emitting device 40 was mounted on the lead frame 22. The n-type ohmic electrode 9 of the group III nitride semiconductor light emitting device 40 was fixed on one of the two wiring boards 22a using eutectic solder paste made of Au/Sn while the p-type ohmic electrode 10 of the group III nitride semiconductor light emitting device 40 was connected to the other wiring board 22a via the bonding pad 12 and the gold wire 21 so that electric current for driving the device can be supplied to the group III nitride semiconductor light emitting device 40 from the lead frame 22.

An electric current for driving the device was applied in the forward direction between the n-type and p-type ohmic electrodes 9 and 10 via the lead frame 22. When the forward current was 20 mA, the forward voltage was 3.2 V. In addition, when a forward current of 20 mA was applied, the center wavelength of the emitted blue light was 460 nm. Moreover, the light emission intensity measured by using a general integrating sphere reached 10 mW which verified that a group III nitride semiconductor light emitting device emitting high intensity light was obtained.

Thereafter, as shown in FIG. 4, the capsulating resin which includes phosphor 24 made of glass epoxy resin containing a silicate phosphor was injected in the reflector 23 and then was solidified due to a heat treatment carried out by retaining the resulting structure in an annealing furnace at 150° C. for 6 hours. Note that the amount of phosphor used in the phosphor 24 was one which was determined by an experiment conducted in advance so that the material exhibits a white color when excited by light from the LED chip that constituted the lamp. In addition, since the precipitation of the phosphor occurred when solidifying the fluorescent resin 24, the distribution of the phosphor showed higher concentration thereof in the region close to the LED chip. After solidifying the fluorescent resin 24, the lamp shown in FIG. 4 was obtained by further injecting the sealing resin 25 followed by the shaping thereof on the fluorescent resin 24 so as to seal the entire reflector 23.

In the lamp obtained as described above, an electric current for driving the device was applied in the forward direction between the n-type and p-type ohmic electrodes 9 and 10 via the lead frame 22. When a forward current of 20 mA was applied, the emitted light was white. In addition, it was verified that the light emission efficiency was satisfactory reaching 70 lm/W.

COMPARATIVE EXAMPLE 1

A group III nitride semiconductor light emitting device was produced in the same manner as in Example 1 except that a GaN layer uniformly containing germanium (Ge) was grown instead of the repetitive impurity layer 3 of the group III nitride semiconductor light emitting device 40 produced in Example 1.

When the semiconductor laminated structure obtained in Comparative Example 1 was analyzed by secondary ion mass spectrometry (SIMS) in the same manner as in Example 1, the thickness of the GaN layer containing germanium (Ge) was 2,000 nm and the concentration of impurity atoms was $1.2 \times 10^{19}$ cm$^{-1}$.

In addition, the carrier concentration of the GaN layer containing Ge in the obtained semiconductor laminated structure 11 according to Hall measurement was $1.2 \times 10^{19}$ cm$^{-3}$. Moreover, as a result of observing the surface of the GaN layer containing Ge using an optical microscope, the occurrence of cracks was verified.

In addition, when the forward voltage and the light emission intensity were measured in the same manner as in Example 1, although the forward voltage was 3.2 V and was equal to that obtained in Example 1, the light emission intensity was 0.4 mW and the emission of only low intensity light compared to that obtained in Example 1 was achieved.

INDUSTRIAL APPLICABILITY

The present invention can be applied to a group III nitride semiconductor light emitting device, a method for producing a group III nitride semiconductor light emitting device, and a lamp thereof. In particular, the present invention can be applied to a group III nitride semiconductor light emitting device that employs a semiconductor laminated structure having low resistance and excellent smoothness and has a low driving voltage and excellent device characteristics.

The invention claimed is:

1. A group III nitride semiconductor light emitting device comprising:
    a semiconductor laminated structure;
    a light emitting layer composed of a group III nitride semiconductor; and
    electrodes each formed on a front surface and on a back surface of the semiconductor laminated structure,
    wherein the semiconductor laminated structure comprises at least
    an impurity layer composed of a high concentration layer made of a group III nitride semiconductor containing a high concentration of impurity atoms, and a low concentration layer made of a group III nitride semiconductor containing impurity atoms whose concentration is lower than that of the high concentration layer, and
    a group III nitride semiconductor layer, and
    the low concentration layer and the high concentration layer, of 10 to 1000 layers, are continuously formed on the group III nitride semiconductor layer in this order.

2. The group III nitride semiconductor light emitting device according to claim 1,
    wherein a plurality of the impurity layers are provided, each arranged adjacent to one another.

3. The group III nitride semiconductor light emitting device according to claim 1,
    wherein thicknesses of the high concentration layer and the low concentration layer are both within the range of 0.5 to 500 nm.

4. The group III nitride semiconductor light emitting device according to claim 1,
    wherein a thickness of the low concentration layer is greater than or equal to a thickness of the high concentration layer.

5. The group III nitride semiconductor light emitting device according to claim 1,
wherein a thickness of the impurity layer as a whole is within the range of 0.1 to 10 μm.

6. The group III nitride semiconductor light emitting device according to claim 1,
wherein a concentration of impurity atoms in the high concentration layer is within the range of $5 \times 10^{17}$ to $5 \times 10^{19}$ cm$^{-3}$.

7. The group III nitride semiconductor light emitting device according to claim 1,
wherein a concentration of impurity atoms in the low concentration layer is less than or equal to $2 \times 10^{19}$ cm$^{-3}$.

8. The group III nitride semiconductor light emitting device according to claim 1,
wherein the impurity atoms are those of one element selected from the group consisting of silicon (Si), germanium (Ge), sulfur (S), selenium (Se), tin (Sn), and tellurium (Te) or those in which two or more of these elements.

9. The group III nitride semiconductor light emitting device according to claim 1,
wherein the group III nitride semiconductor layer is made of an electrically conductive gallium nitride based compound semiconductor.

10. The group III nitride semiconductor light emitting device according to claim 1,
wherein the group III nitride semiconductor layer is formed on an electrically conductive base.

11. The group III nitride semiconductor light emitting device according to claim 10, wherein a conductivity type of the impurity layer is the same as that of the base.

12. The group III nitride semiconductor light emitting device according to claim 10, wherein the base is made of silicon (Si) or zinc oxide (ZnO).

13. A method for producing a group III nitride semiconductor light emitting device, said Group III nitride semiconductor light emitting device comprising a semiconductor laminated structure, a light emitting layer composed of a group III nitride semiconductor, and electrodes each formed on a front surface and on a back surface of the semiconductor laminated structure and in which the semiconductor laminated structure includes at least an impurity layer composed of a high concentration layer made of a group III nitride semiconductor containing high concentration of impurity atoms, and a low concentration layer made of a group III nitride semiconductor containing impurity atoms whose concentration is lower than that of the high concentration layer, and a group III nitride semiconductor layer, the method comprising:
forming the low concentration layer and the high concentration layer, of 10 to 1000 layers, continuously on the group III nitride semiconductor layer in this order.

14. The method for producing a group III nitride semiconductor light emitting device according to claim 13,
which comprises forming the impurity layer by doping the impurity atoms when forming the high concentration layer but not when forming the low concentration layer.

15. The method for producing a group III nitride semiconductor light emitting device according to claim 13, further comprising
forming the group III nitride semiconductor layer on a base.

16. The method for producing a group III nitride semiconductor light emitting device according to claim 15, wherein the base is electrically conductive.

17. The method for producing a group III nitride semiconductor light emitting device according to claim 15, further comprising
removing the base after forming the group III nitride semiconductor layer on the base, and
wherein the base is insulative.

18. The method for producing a group III nitride semiconductor light emitting device according to claim 13,
wherein the group III nitride semiconductor layer is made of a gallium nitride based compound semiconductor.

19. A lamp comprising the group III nitride semiconductor light emitting device according to claim 1.

* * * * *